United States Patent
Yeh

(10) Patent No.: US 6,797,067 B1
(45) Date of Patent: Sep. 28, 2004

(54) IMPLANTER TOOL PROCESS PARAMETER AUTO PRE-SETUP SYSTEM

(75) Inventor: Fong Yeh, Hsinchu (TW)

(73) Assignee: Macronix International Co., Ltd. (TW)

(*) Notice: Subject to any disclaimer, the term of this patent is extended or adjusted under 35 U.S.C. 154(b) by 153 days.

(21) Appl. No.: 10/151,067

(22) Filed: May 17, 2002

(51) Int. Cl.[7] .......................... C23C 16/00; H05H 1/00
(52) U.S. Cl. .................. 118/719; 118/712; 156/345.24; 156/345.31
(58) Field of Search .................. 118/712, 719, 118/695, 697; 156/345.24, 345.31, 345.32, 345.54; 250/492.23, 492.3, 492.21

(56) References Cited

U.S. PATENT DOCUMENTS

| | | | | |
|---|---|---|---|---|
| 5,609,689 A | * | 3/1997 | Kato et al. ................. | 118/719 |
| 6,224,638 B1 | * | 5/2001 | Jevtic et al. ............... | 29/25.01 |
| 6,258,169 B1 | * | 7/2001 | Asano ........................ | 118/697 |
| 6,558,509 B2 | * | 5/2003 | Kraus et al. ............... | 156/345.54 |

FOREIGN PATENT DOCUMENTS

WO     WO 200229861 A2 * 4/2002 ........... C23C/16/00

* cited by examiner

Primary Examiner—Parviz Hassanzadeh
(74) Attorney, Agent, or Firm—Martine & Penilla, LLP

(57) ABSTRACT

An invention is provided for an implanter tool process parameter setup system. The implanter tool process parameter setup system includes a first sensor capable of obtaining a first lot identifier (ID) from a first POD, and a controller that is in communication with an implanter tool. The controller is capable of adjusting parameters of the implanter tool based on a process recipe. Further included in the system is a database that stores a plurality of lot IDs and a plurality of process recipes, wherein each lot ID corresponds to a particular process recipe. A computer is in communication with the first sensor, the controller, and the database, wherein the computer is capable of obtaining a process recipe corresponding to the first lot ID from the database, and wherein the computer is further capable of providing the process recipe to the controller.

10 Claims, 6 Drawing Sheets

IMPLANTER TOOL PROCESS PARAMETER AUTO PRE-SETUP SYSTEM

BACKGROUND OF THE INVENTION

1. Field of the Invention

This invention relates generally to semiconductor manufacturing and more particularly to an automated control process to perform implantation setup.

2. Description of the Related Art

The manufacturing of semiconductor devices often involves the processing of a semiconductor substrate through a series of fabrication processes. One such process is an ion implantation process that implants dopant ions into the semiconductor substrate using an ion implanter.

To allow proper ion implantation, sources of contamination, such as personnel, equipment, and chemicals, need to be kept away from the semiconductor articles. For example, skin flakes shed by personnel can easily ionize semiconductor substrates, causing defects in the semiconductor devices. In addition, semiconductor processing equipment itself generate defect causing particles. Although clean room garments reduce particle emissions, clean room garments do not completely eliminate contamination.

To minimize contamination defects, wafers typically are isolated from contaminant generating agents. One scheme used to isolate wafers from contaminant generating agents is the standardized mechanical interface (SMIF) system. Conventionally, SMIF systems have been used to reduce semiconductor article contamination as the wafers are transported from one station to another in a manufacturing line. SMIF is based on the concept that if a component is held in an environment of its own, that itself is free of contaminants, then that environment is the cleanest environment that is attainable. Hence, SMIF systems often utilize PODs, which hold cassettes of wafers, built with this principle in mind. For example, air in a POD can be held in a "class 10" environment, meaning that the environment has a maximum of 10 particles per cubic foot, or 350 particles per cubic meter.

The high level of automation used in fabricating semiconductor devices relies on sophisticated handling and transport equipment for moving semiconductor wafers between various processing stations. Most handling and transport operations are conducted under automatic control using a programmable logic controller, or other programmed computer, which issues control signals for operating the equipment with little or no intervention by an operator. Nevertheless, there are certain situations where operator intervention becomes necessary, consequently the automated wafer handling equipment mentioned above normally includes a series of manual controls that permit the operator to separately control each stage of movement of the wafers. For example, during the ion implant process most process steps are performed by human operators, such as cassette loading, recipe selection, and Bin adjusting. Moreover, these operations generally are performed consecutively. For example, the cassettes are loaded, and thereafter, the process recipe is selected.

In view of the foregoing, there is a need for an auto-control implantation setup process. The process should be automated to reduce human error, and should further allow simultaneous process operations to reduce process time.

SUMMARY OF THE INVENTION

Broadly speaking, the present invention fills these needs by providing a process parameter auto pre-setup system for an implanter tool. In one embodiment, an implanter tool process parameter setup system is disclosed. The implanter tool process parameter setup system includes a first sensor capable of obtaining a first lot identifier (ID) from a first POD, and a controller that is in communication with an implanter tool. The controller is capable of adjusting parameters of the implanter tool based on a process recipe. Further included in the system is a database that stores a plurality of lot IDs and a plurality of process recipes, wherein each lot ID corresponds to a particular process recipe. A computer is in communication with the first sensor, the controller, and the database, wherein the computer is capable of obtaining a process recipe corresponding to the first lot ID from the database, and wherein the computer is further capable of providing the process recipe to the controller.

A method for implanter tool process parameter setup is disclosed in a further embodiment of the present invention. A first lot ID is obtained from a first POD, and a lookup operation is performed using a database to obtain a first process recipe corresponding to the first lot ID. In addition, the first process recipe is verified using a recipe management system that stores a plurality of process recipes. The first process recipe is provided to a controller, which is in communication with an implanter tool. The controller then adjusts parameters of the implanter tool based on the first process recipe.

Advantageously, embodiments of the present invention allow auto-control of process setup. Further, the embodiments of the present invention are capable of loading PODs and adjusting Bin settings simultaneously. As a result, process times can be reduced by over ninety seconds when utilizing the embodiments of the present invention. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a process parameter auto pre-setup system for an implanter tool. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
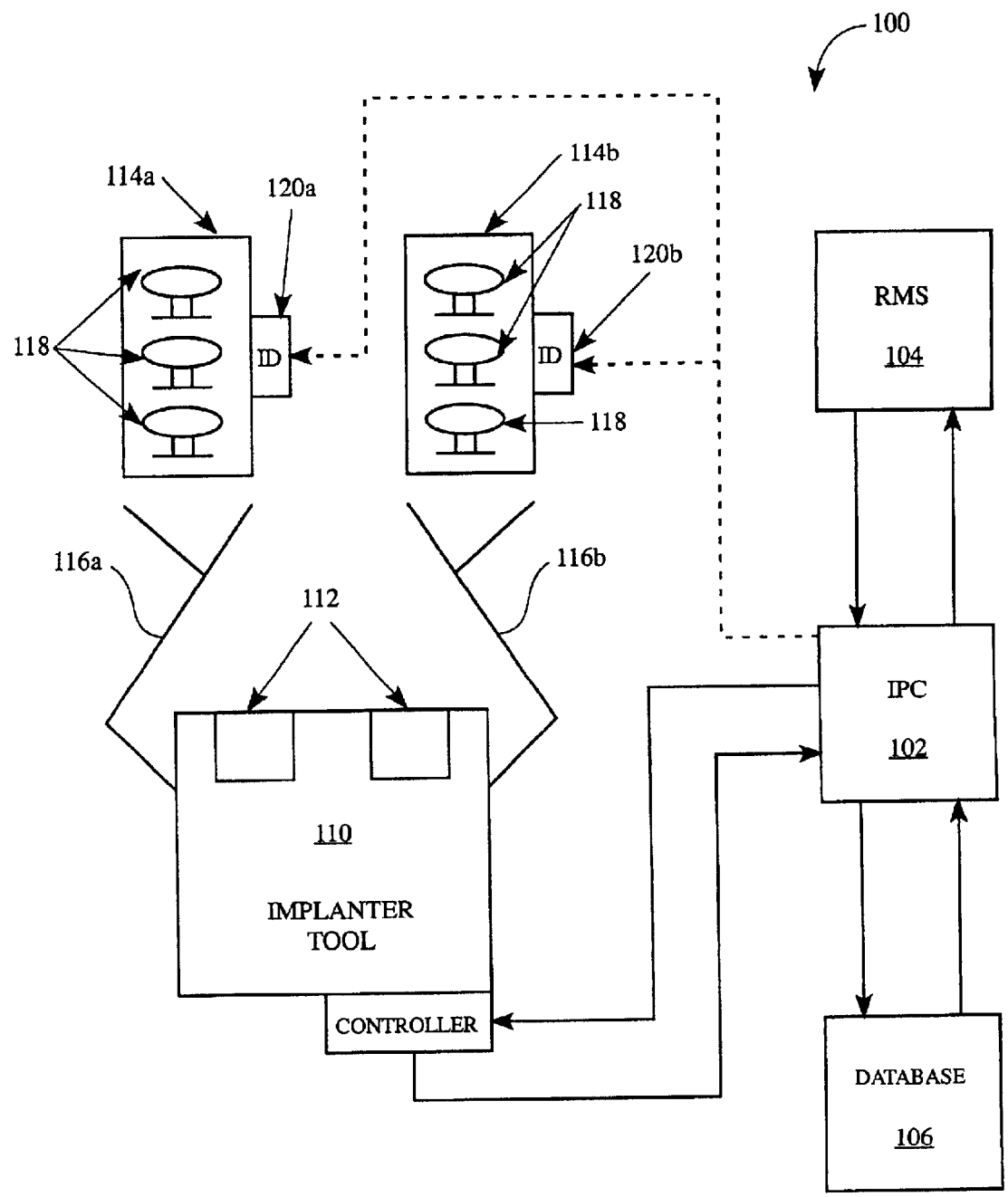
FIG. 1 is a diagram showing a process parameter auto pre-setup system for an implanter tool, in accordance with an embodiment of the present invention.

FIG. 1 is a diagram showing a process parameter auto pre-setup system 100 for an implanter tool, in accordance with an embodiment of the present invention. The process parameter auto pre-setup system 100 includes an industrial personal computer 102 in communication with a recipe management system (RMS) 104 and a database 106. The industrial personal computer 102 is further in communication with a controller 108, which is capable of providing system control to an implanter tool 110. The implanter tool 110 includes two loading doors 112, which allow loading of PODs 114a and 114b, via SMIF arms 116a and 116b. The PODs 114a and 114b are utilized to transport wafers, which are stored in cassettes 118.

As mentioned above, the process parameter auto pre-setup system 100 includes a controller 108 that is in communication with the implanter tool 110. The controller 108 provides processing control for the implanter tool 110. In particular, the controller 108 is capable of adjusting Bin settings of the implanter tool 110 according to process recipes provided by the industrial personal computer 102. In addition, the controller is capable of controlling the loading of the PODs 114a and 114b into the implanter tool 110 via the SMIF arms 116a and 116b.

Figure 2:
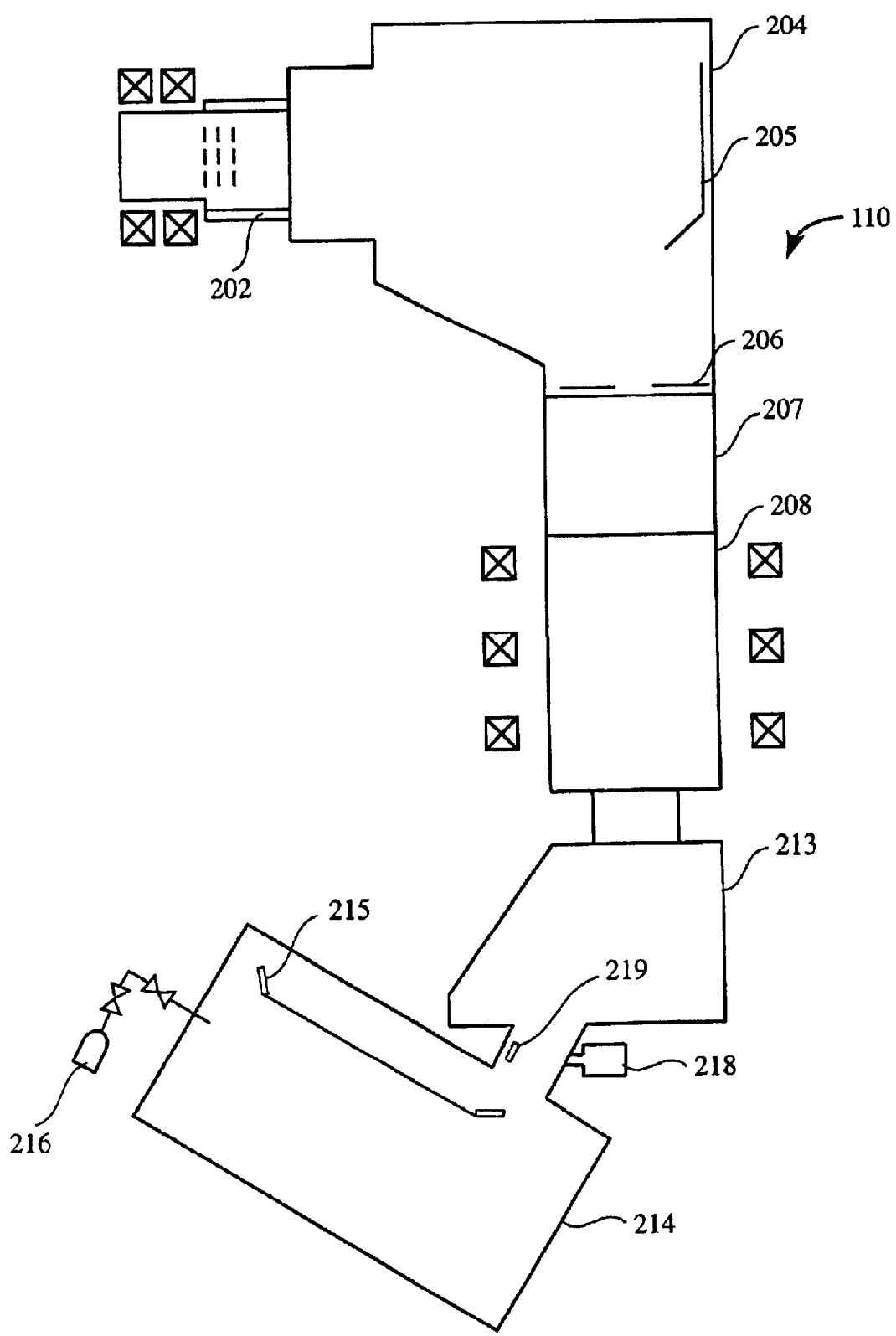
FIG. 2 is a cross-sectional view of an exemplary implanter tool.

The implanter tool 110 implants dopant ions into the semiconductor substrate. FIG. 2 is a cross-sectional view of an exemplary implanter tool 110. In operation, a magnetic field in the mass separator 204 is applied to an ion beam, generated by ion source 202, to change the direction thereof, such that only the ion species to be implanted into a wafer 215 arrive at the wafer 215. As a result, ions that should not be implanted into the wafer 215 collide with a beam dump 205 or an isolation slit 206 arranged in the mass separator 204.

A post acceleration tube 207 accelerates the ion beam to have energy necessary for being implanted. In addition, the ion beam is introduced to a quadrupole lens section 208, which shapes the ion beam to a suitable beam shape for implantation into the wafer 215. The shaped ion beam leaving the quadrupole lens section 208 is transmitted to an ion beam deflection section 213 that isolates and removes electrically neutral components. In this manner, only the ion components are introduced to the ion implantion room 214 to be implanted to the wafer 215.

Referring back to FIG. 1, central control for the implanter tool process parameter auto pre-setup system 100 is provided by the industrial personal computer 102. When PODs 114a and 114b are made available, the industrial personal computer 102 obtains the lot identifier (ID) 120a from the first POD 114a, which is located on the first SMIF arm 116a. In one embodiment, the industrial personal computer 102 is in communication with sensors, which are capable of reading the lot IDs from the PODs. The industrial personal computer 102 then utilizes the lot ID to obtain process recipe parameters from the database 106.

The database 106 stores a plurality of process recipes used to process the wafers 118 present within the PODs 114a and 114b. In one embodiment, each cassette of wafers 118 is provided with a lot ID 120 that identifies the wafers 118 present within a POD. The lot ID is also stored within the database 106, along with corresponding recipe parameters for processing the wafers 118 identified by the lot ID. In this manner, the industrial personal computer 102 can read the lot ID for a particular POD present on a SMIF arm and obtain the proper process recipe for wafers 118. In addition, embodiments of the present invention can provide additional information for each lot ID, such as route and site information.

Upon obtaining the process recipe corresponding to the lot ID 120a, the industrial personal computer 102 transmits the process recipe to the RMS 104, which verifies the process recipe parameters. The RMS 104 stores a plurality of process recipes for processing wafers within the implanter tool 110. These process recipes are used by the embodiments of the present invention to verify the process recipe parameters obtained from the database 106 for the individual lot IDs.

Having obtained and verified the process recipe corresponding to the lot ID 120a of the first POD 114a, the industrial personal computer 102 queries the controller 108 to determine whether the obtained process recipe is presently stored in the controller 108. As mentioned previously, the controller 108 provides process control to the implanter tool 110. This is accomplished by loading process recipes into the controller 108, which stores the loaded recipe. Hence, the controller 108 is capable of storing a particular process recipe for use in several processing operations. Then, when the process recipe for the current POD is different, the new process recipe can be loaded into the controller 108 using the industrial personal computer 102. The controller 108 then adjusts the Bin settings according to the process recipe, and loads the first POD 114a into the implanter tool 110.

In addition, the industrial personal computer 102 obtains the lot ID 120b of the second POD 114b loaded on the second SMIF arm 116b. The industrial personal computer 102 examines the second lot ID 120b to determine whether the second lot ID 120b and the first lot ID 120a are members of the same group of lot IDs. Lot IDs can be arranged in groups, wherein each lot ID of the group shares a common process recipe for the implanter tool. Thus, when lot IDs are members of the same group of lot IDs, the lots share the same process recipe.

Thus, if the first lot ID 120a and the second lot ID 120b are members of the same group of lot IDs, the first POD 114a and the second POD 114b share a common process recipe and thus can be processed together. Accordingly, when the first lot ID 120a and the second lot ID 120b are members of the same group of lot IDs, the second POD 114b is loaded into the implanter tool 110 along with the first POD 114a.

When the first lot ID 120a and the second lot ID 120b are not members of the same group of lot IDs, an error message is raised and the second SMIF arm 116b is stopped to wait for correction. In addition, if the second SMIF arm 116b remains empty for predetermined period of time after the first SMIF arm 116a is occupied, the second SMIF arm 116b can be stopped so that only the first POD 114a is loaded into the implanter tool 110.

Figure 3:
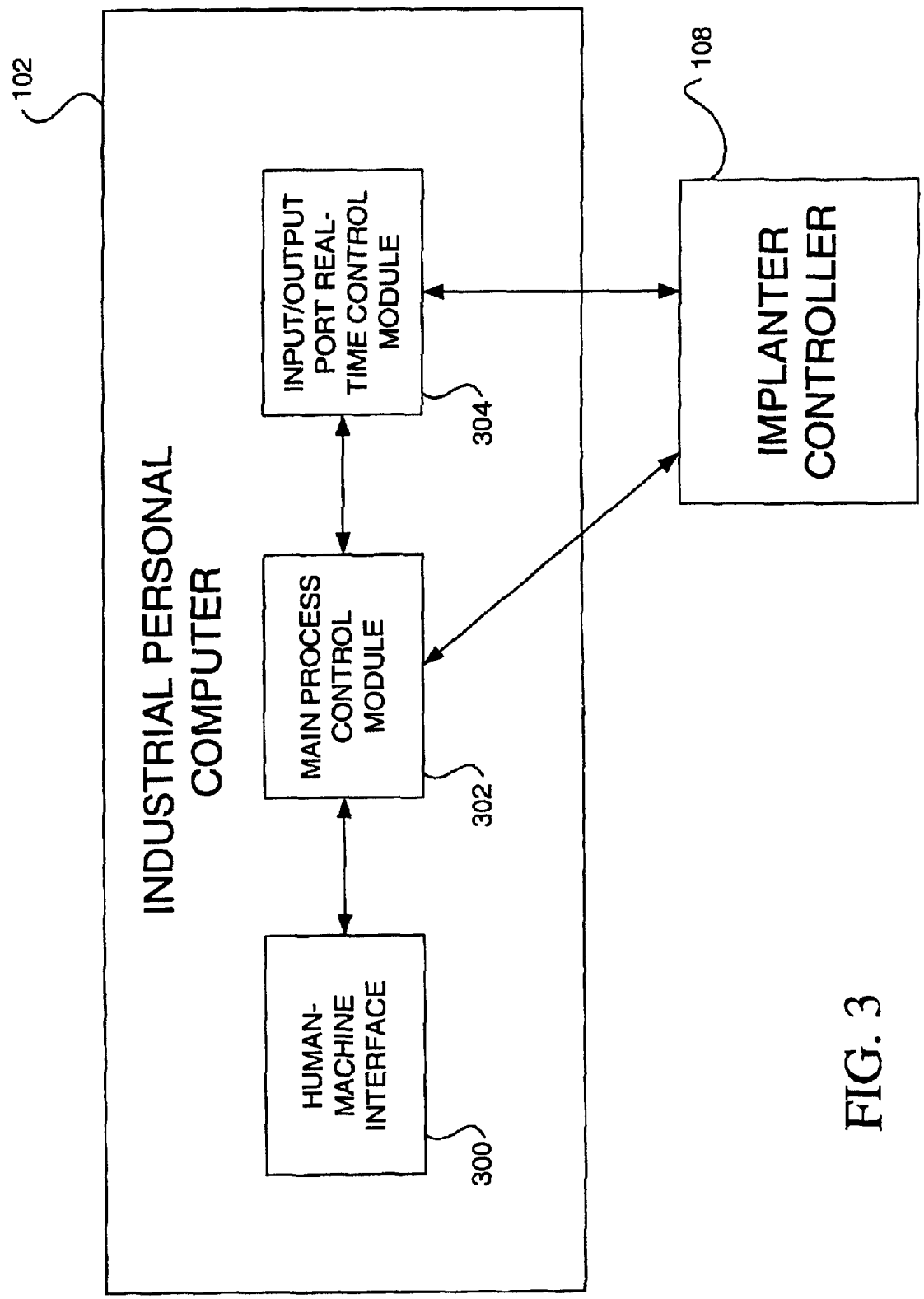
FIG. 3 is a block diagram showing and exemplary industrial personal computer software configuration, in accordance with an embodiment of the present invention.

FIG. 3 is a block diagram showing and exemplary industrial personal computer 102 software configuration, in accordance with an embodiment of the present invention. As shown in FIG. 3, the industrial personal computer 102 is in communication with the implant controller 108, and is responsible for human-machine interface visual function, real-time controlling input/output, and main process control.

For the purpose of providing human-machine interface and visual function, real-time controlling of input/output system, and main process control, the industrial personal computer 102 is divided into three sub-systems: a human-machine interface and visual function module 300, main process control module 302, and module of input/output port real-time control 304.

The human-machine interface and visual function module 300 handles the human-machine interface and image processing. This includes file management, teaching mode of component and machine position, switching of automatic/manual mode, setting and modification of system parameter/machine position, setting and modification of product parameters, statistic data, performing calculation, hard disk and floppy disk control, self test of input/output and random memory access, in addition to fast keys, such as start key, pause key, and other keyboard shortcuts.

The functions of image processing include image display, which can be gray-level display, dichromatic display, continuous image capturing, and image frozen processing. The functions involve pattern matching, lead locator, and calibration. Image control module and human-machine interface belong to the same process module and are in the category of visual function of an industrial personal computer.

The main process control module 302 can include error message handling modules, a lot ID sensor reading module, and communication control module. For the purpose of data transfer, the main process control module 302 can be connected to the implanter controller 108 through a serial communication port. The input/output port real-time control module 304 handles the real-time control of the system.

Figure 4:
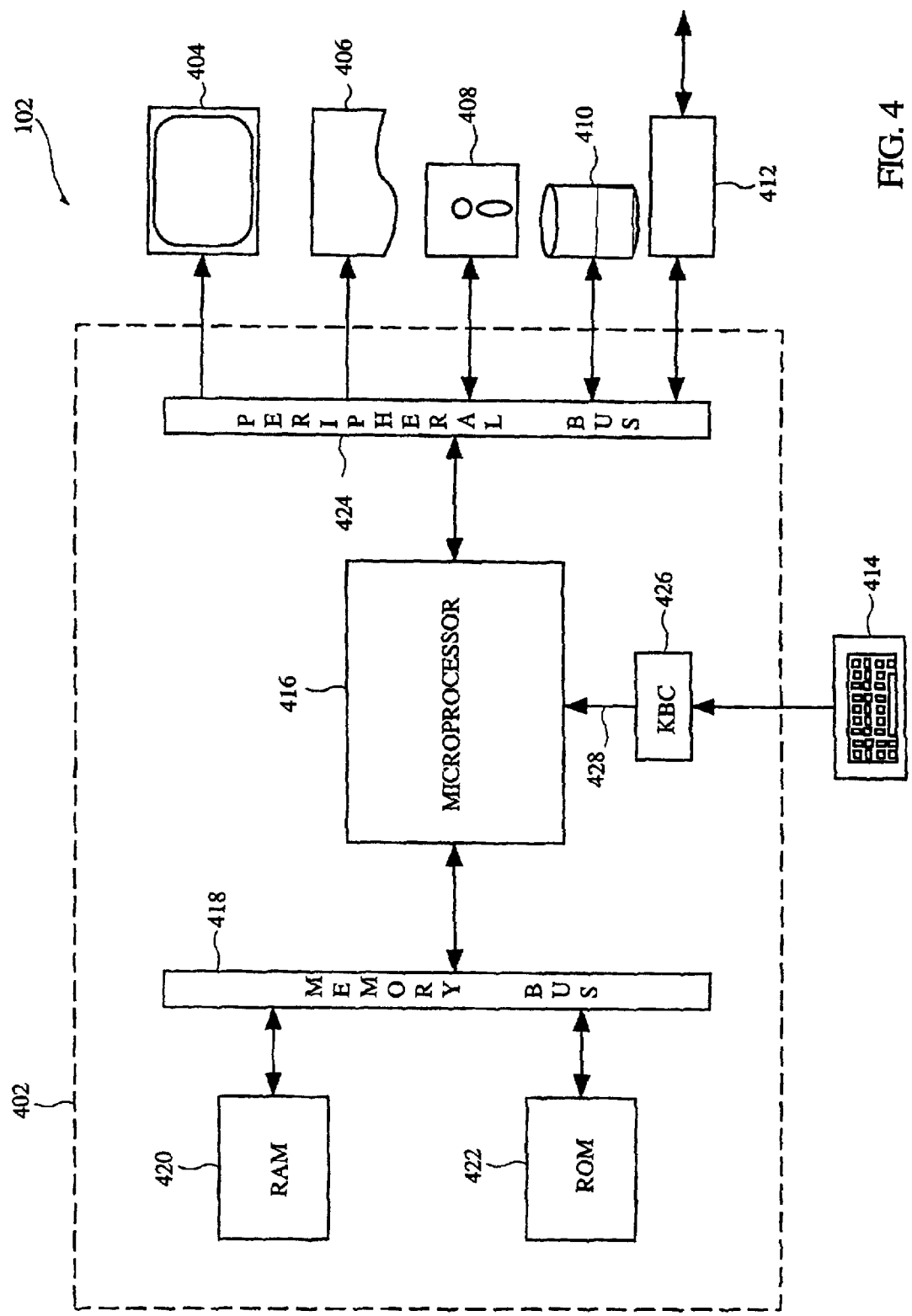
FIG. 4 is a block diagram of an exemplary industrial personal computer for carrying out the processing according to the invention.

FIG. 4 is a block diagram of an exemplary industrial personal computer 102 for carrying out the processing according to the invention. The industrial personal computer 102 includes a digital computer 402, a display screen (or monitor) 404, a floppy disk drive 408, a hard disk drive 410, a network interface 412, and a keyboard 414. The digital computer 402 includes a microprocessor 416, a memory bus 418, random access memory (RAM) 420, read only memory (ROM) 422, a peripheral bus 424, and a keyboard controller (KBC) 426. The digital computer 402 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 416 can be a general purpose digital processor, which controls the operation of the industrial personal computer 102. The microprocessor 416 can be a single-chip processor or can be implemented with multiple components. Using instructions retrieved from memory, the microprocessor 416 controls the reception and manipulation of input data and the output and display of data on output devices. According to the invention, a particular function of microprocessor 416 is to obtain process recipes from the database using POD lot IDs and load the process recipes into the controller.

The memory bus 418 is used by the microprocessor 416 to access the RAM 420 and the ROM 422. The RAM 420 is used by the microprocessor 416 as a general storage area and as scratch-pad memory, and can also be used to store input data and processed data The ROM 422 can be used to store instructions or program code followed by the microprocessor 416 as well as other data.

The peripheral bus 424 is used to access the input, output, and storage devices used by the digital computer 402. In the described embodiment, these devices include the display screen 404, the printer device 406, the floppy disk drive 408, the hard disk drive 410, and the network interface 412. The keyboard controller 426 is used to receive input from keyboard 414 and send decoded symbols for each pressed key to microprocessor 416 over bus 428.

The display screen 404 is an output device that displays images of data provided by the microprocessor 416 via the peripheral bus 424 or provided by other components in the industrial personal computer 102. The printer device 406, when operating as a printer, provides an image on a sheet of paper or a similar surface. Other output devices such as a plotter, typesetter, etc. can be used in place of, or in addition to, the printer device 406.

The floppy disk drive 408 and the hard disk drive 410 can be used to store various types of data. The floppy disk drive 408 facilitates transporting such data to other computer systems, and hard disk drive 410 permits fast access to large amounts of stored data The microprocessor 416 together with an operating system operate to execute computer code and produce and use data. The computer code and data may reside on the RAM 420, the ROM 422, or the hard disk drive 410. The computer code and data could also reside on a removable program medium and loaded or installed onto the industrial personal computer 102 when needed. Removable program media include, for example, CD-ROM, PC-CARD, floppy disk and magnetic tape.

The network interface 412 is used to send and receive data over a network connected to the controller. An interface card or similar device and appropriate software implemented by the microprocessor 416 can be used to connect the industrial personal computer 102 to the controller.

The keyboard 414 is used by a user to input commands and other instructions to the industrial personal computer 102. Other types of user input devices can also be used in conjunction with the present invention. For example, pointing devices such as a computer mouse, a track ball, a stylus, or a tablet can be used to manipulate a pointer on a screen.

Figure 5:
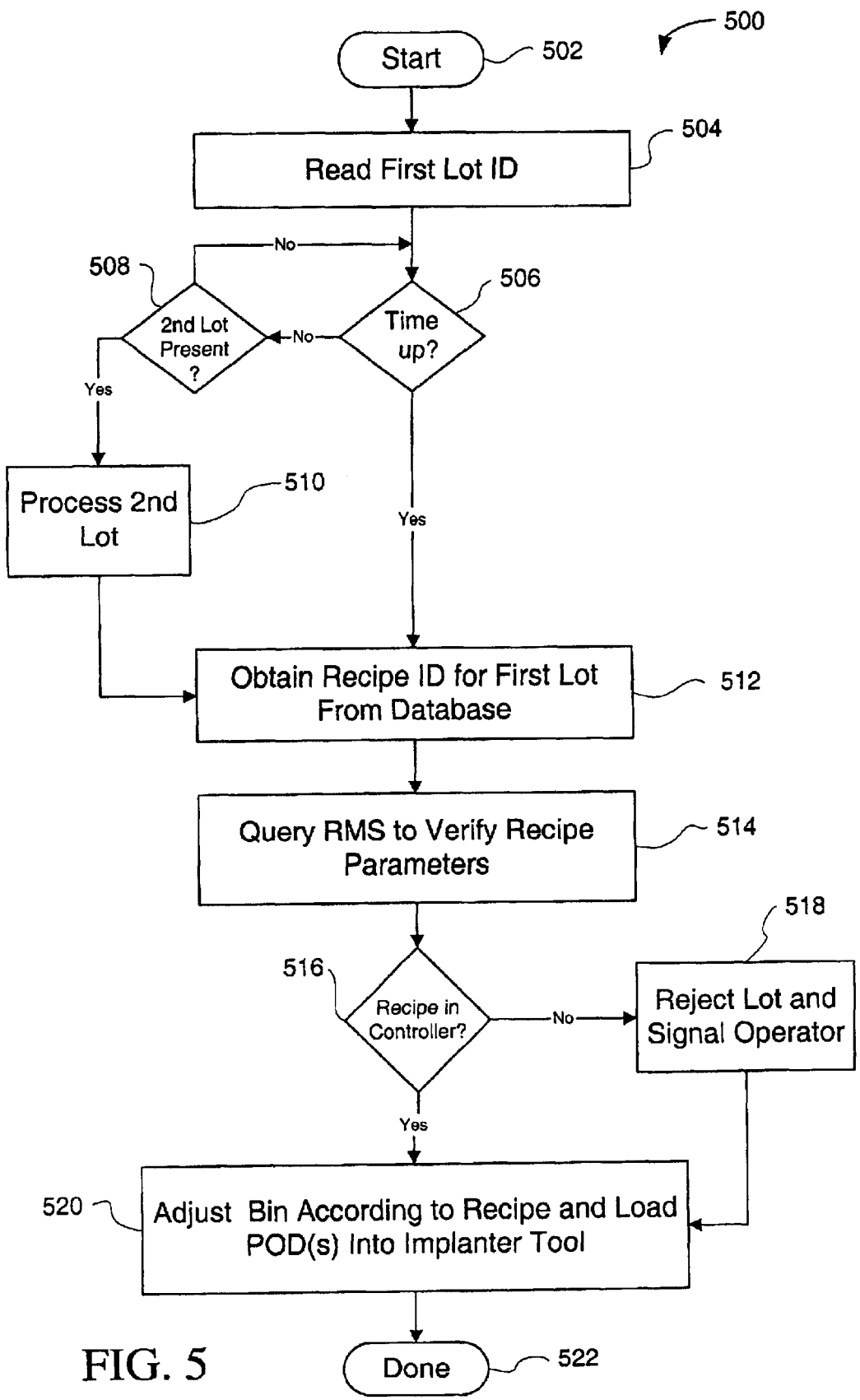
FIG. 5 is a flowchart showing a method for providing process parameter auto setup for an implanter tool, in accordance with an embodiment of the present invention.

FIG. 5 is a flowchart showing a method 500 for providing process parameter auto setup for an implanter tool, in accordance with an embodiment of the present invention. In an initial operation 500, preprocess operations are performed. Preprocess operations can include initial wafer processing, recipe database setup, and other preprocess operations that will be apparent to those skilled in the art.

In operation 504, the industrial personal computer reads the first lot ID from the POD located on the first SMIF arm. Each lot of wafers is provided with a lot ID that identifies the wafers within a POD. As mentioned previously, the lot ID is also stored within a database, along with corresponding recipe parameters for processing the wafers identified by the lot ID. In this manner, the industrial personal computer can read the lot ID for a particular POD present on a SMIF arm and obtain the proper process recipe using the database. In addition, embodiments of the present invention can provide additional information for each lot ID, such as route and site information.

A decision is then made as to whether a predetermined period of time has expired, in operation 506. Embodiments of the present invention are capable of processing two PODs of wafers simultaneously when the wafers of both PODs utilize the same process recipe. In operation 506, embodiments of the present allow the system a predetermined period of time to provide a second POD on the second SMIF arm before loading the first POD into the implanter tool. If the predetermined amount of time has expired, the method 500 continues to operation 512, otherwise the method 500 branches to operation 508.

In operation 508, a decision is made as to whether a second POD is present on the second SMIF arm. If a second POD is present on the second SMIF arm, the second POD is processed in operation 510. Otherwise, the method continues with another time out operation 506. In operation 510, the second POD is processed, as explained in greater detail subsequently with reference to FIG. 6.

Figure 6:
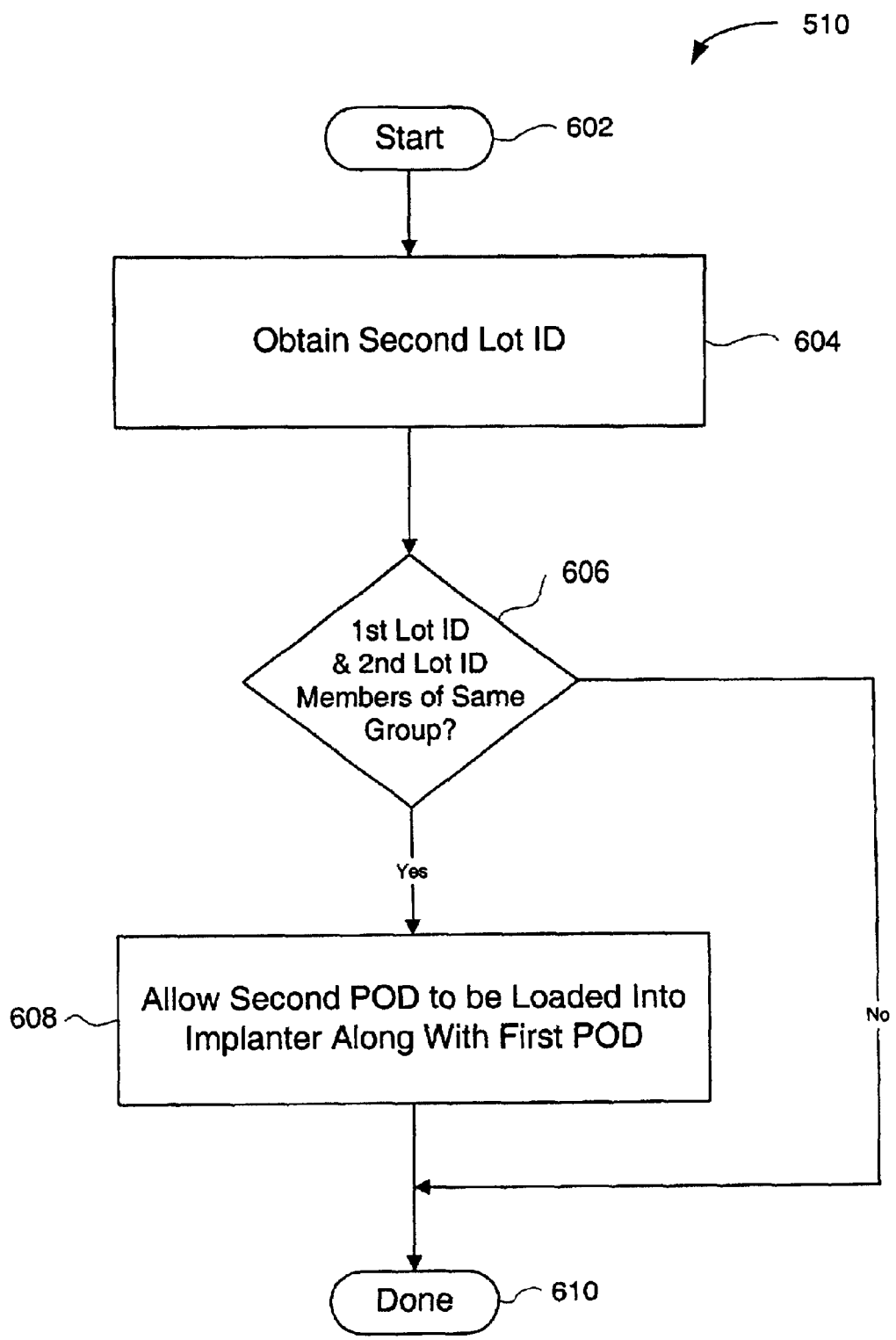
FIG. 6 is a flowchart showing a method for processing a second POD on a second SMIF arm, in accordance with an embodiment of the present invention.

FIG. 6 is a flowchart showing a method 510 for processing a second POD on the second SMIF arm, in accordance with an embodiment of the present invention. In an initial operation 602, preprocess operations are performed. Preprocess operations can include reading the lot ID from the first POD, determining if a second POD is present on the second SMIF arm, and other preprocess operations that will be apparent to those skilled in the art.

In operation 604, the industrial personal computer reads the second lot ID from the second POD located on the second SMIF arm. The industrial personal computer examines the second lot ID to determine whether the second lot ID is a member of the same group of lot IDs of which the first lot ID is a member. That is, lot IDs can be arranged in groups, wherein each lot ID of the group shares a common process recipe for the implanter tool. Thus, when lot IDs are members of the same group of lot IDs, the lots share the same process recipe.

Hence, a decision is made as to whether the first lot ID and the second lot ID are members of the same group, in operation 606. If the first lot ID and the second lot ID are members of the same group, the method 510 continues with operation 608. Otherwise, the method 510 ends in operation 610.

In operation 608, the industrial personal computer is configured to allow the second POD to be loaded into the implanter tool along with the first POD. When the first lot ID and the second lot ID are members of the same group of lot IDs, the first POD and the second POD share a common process recipe and thus can be processed together. Accordingly, when the first lot ID and the second lot ID are members of the same group of lot IDs, the second POD is loaded into the implanter tool along first POD, and the same Bin will be used to implant the wafers of both PODs.

When the first lot ID and the second lot ID are not members of the same group of lot IDs, and error message is raised and the second SMIF arm is stopped to wait for correction. In addition, if the second SMIF arm remains empty for predetermined period of time after the first SMIF arm is occupied, the second SMIF arm can be stopped so that only the first POD is loaded into the implanter tool.

Post process operations are performed in operation 610. Post process operations can include obtaining the recipe for the first POD, verifying the obtained recipe, and other post process operations that will be apparent to those skilled in the art after a careful reading of the present disclosure.

Referring back to FIG. 5, a recipe corresponding to the first lot ID is obtained from the database, in operation 512. The database stores a plurality of process recipes used to process the wafers present within the PODs. As mentioned previously, each lot ID is stored in the database along with its corresponding process recipe. In operation 512, the industrial personal computer utilizes the lot ID to lookup the corresponding process recipe for the POD on the first SMIF arm.

Having obtained the process recipe, the industrial personal computer queries the RMS to verify the recipe parameters, in operation 514. As mentioned above, the RMS stores a plurality of process recipes for the implanter tool, which are used by the industrial personal computer to verify the process recipe parameters obtained from the database for the individual lot IDs.

A decision is then made as to whether the obtained and verified process recipe is currently loaded in the controller, in operation 516. If the obtained and verified process recipe is currently loaded in the controller, the method 500 continues to operation 520. Otherwise, the method 500 branches to operation 518.

If the recipe is not in the controller, the lot is rejected and the operator is signaled, in operation 518. In operation 518, the lot, or lots, are rejected and the implanter tool signals the operator. For example, the system can show an alarm to alert the operator. The controller adjusts the Bin according to the obtained recipe and loads the first POD, and possibly the second POD, into the implanter tool, in operation 520. As above, the controller can load the second POD into the implanter tool along with the first POD if the wafers of both PODs share the same process recipe.

Post process operations are performed in operation 522. Post process operations can include loading new PODs on the SMIF arms, performing the ion implant process using the implanter tool, and other post process operations that will be apparent to those skilled in the art. Advantageously, embodiments of the present invention allow auto-control of process setup. Further, the embodiments of the present invention are capable of loading PODs and adjusting Bin settings simultaneously. As a result, process times can be reduced by in excess of ninety seconds when utilizing the embodiments of the present invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An implanter tool process parameter setup system, comprising:
   a first sensor capable of obtaining a first lot identifier (ID) from a first pod;
   a controller in communication with an implanter tool, the controller capable of adjusting parameters of the implanter tool based on a process recipe;
   a database storing a plurality of lot IDs and a plurality of process recipes, each lot ID corresponding to a particular process recipe; and
   a computer in communication with the first sensor, the controller, and the database, wherein the computer is capable of obtaining a process recipe corresponding to the first lot ID from the database, and wherein the computer is further capable of providing the process recipe to the controller.

2. An implanter tool process parameter setup system as recited in claim 1, further comprising a second sensor in communication with the computer, the second sensor being capable of obtaining a second lot ID from a second pod.

3. An implanter tool process parameter setup system as recited in claim 2, wherein the first lot ID is part of a first group of lot IDs that correspond to a common process recipe.

4. An implanter tool process parameter setup system as recited in claim 3, wherein the computer determines whether the second lot ID is part of the first group of lot IDs.

5. An implanter tool process parameter setup system as recited in claim 4, wherein the computer instructs the controller to load both the first pod and the second pod into the implanter tool when the second lot ID is part of the first group of lot IDs.

6. An implanter tool process parameter setup system as recited in claim 1, further comprising a recipe management system in communication with the computer, the recipe management system storing a plurality of process recipes.

7. An implanter tool process parameter setup system as recited in claim 6, wherein the computer compares the process recipe corresponding to the first lot ID to a corresponding recipe in the recipe management system to verify parameters of the process recipe corresponding to the first lot ID.

8. An implanter tool process parameter setup system, comprising:

a first sensor capable of obtaining a first lot identifier (ID) from a first pod, wherein the first lot ID is part of a first group of lot IDs that correspond to a common process recipe;

a second sensor capable of obtaining a second lot ID from a second pod;

a controller in communication with an implanter tool, the controller capable of adjusting parameters of the implanter tool based on a process recipe;

a database storing a plurality of lot IDs and a plurality of process recipes, each lot ID corresponding to a particular process recipe; and a computer in communication with the first sensor, the second sensor, the controller, and the database, wherein the computer is capable of obtaining a process recipe corresponding to the first lot ID from the database, and wherein the computer is further capable of providing the process recipe to the controller, wherein the computer determines whether the second lot ID is part of the first group of lot IDs, and wherein the computer instructs the controller to load both the first pod and the second pod into the implanter tool when the second lot ID is part of the first group of lot IDs.

9. An implanter tool process parameter setup system as recited in claim 8, further comprising a recipe management system in communication with the computer, the recipe management system storing a plurality of process recipes.

10. An implanter tool process parameter setup system as recited in claim 9, wherein the computer compares the process recipe corresponding to the first lot ID to a corresponding recipe in the recipe management system to verify parameters of the process recipe corresponding to the first lot ID.

* * * * *